United States Patent
Obata et al.

(10) Patent No.: US 10,312,412 B2
(45) Date of Patent: Jun. 4, 2019

(54) GROUP III NITRIDE SEMICONDUCTOR LUMINESCENCE ELEMENT

(71) Applicant: Stanley Electric Co., Ltd., Tokyo (JP)

(72) Inventors: Toshiyuki Obata, Yamaguchi (JP); Tomoaki Satou, Yamaguchi (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 15/555,098

(22) PCT Filed: Feb. 29, 2016

(86) PCT No.: PCT/JP2016/055992
§ 371 (c)(1),
(2) Date: Sep. 1, 2017

(87) PCT Pub. No.: WO2016/143574
PCT Pub. Date: Sep. 15, 2016

(65) Prior Publication Data
US 2018/0040770 A1     Feb. 8, 2018

(30) Foreign Application Priority Data
Mar. 6, 2015   (JP) .................. 2015-044744

(51) Int. Cl.
*H01L 33/32*     (2010.01)
*H01L 33/06*     (2010.01)
(Continued)

(52) U.S. Cl.
CPC .............. *H01L 33/32* (2013.01); *H01L 33/06* (2013.01); *H01L 33/38* (2013.01); *H01L 33/58* (2013.01)

(58) Field of Classification Search
CPC ......... H01L 33/32; H01L 33/06; H01L 33/58; H01L 33/38; H01L 33/14; H01L 33/145; H01L 33/382; H01L 33/385
See application file for complete search history.

(56) References Cited

U.S. PATENT DOCUMENTS

| 8,643,044 B2 | 2/2014 | Tachibana et al. |
| 2006/0091786 A1 | 5/2006 | Chakraborty et al. |
(Continued)

FOREIGN PATENT DOCUMENTS

| JP | 2007134700 A | 5/2007 |
| JP | 2007-214569 A | 8/2007 |
(Continued)

OTHER PUBLICATIONS

International Search Report, PCT/JP2016/055992, dated Apr. 19, 2016.
(Continued)

*Primary Examiner* — Sonya D. McCall-Shepard
(74) *Attorney, Agent, or Firm* — Cahn & Samuels, LLP

(57) ABSTRACT

A group III nitride semiconductor light emitting element includes an active layer between an n-type layer and a p-type layer, having an n-electrode on the n-type layer and a p-electrode on the p-type layer, and having a mesa structure containing the p-type layer. In a top view of the group III nitride semiconductor light emitting element, the distance between a portion of an end part of the mesa structure and the periphery of the p-electrode is ⅓ or more of a diffusion length $L_s$.

9 Claims, 10 Drawing Sheets

(51) Int. Cl.
*H01L 33/58* (2010.01)
*H01L 33/38* (2010.01)

(56) References Cited

U.S. PATENT DOCUMENTS

| | | | |
|---|---|---|---|
| 2006/0138445 A1* | 6/2006 | Zhao | H01L 33/20 257/102 |
| 2006/0284191 A1 | 12/2006 | Yang et al. | |
| 2007/0102715 A1 | 5/2007 | Ko et al. | |
| 2007/0181888 A1 | 8/2007 | Kim et al. | |
| 2012/0061713 A1 | 3/2012 | Tachibana et al. | |
| 2012/0326117 A1 | 12/2012 | Tanaka et al. | |
| 2014/0209923 A1 | 7/2014 | Xie et al. | |

FOREIGN PATENT DOCUMENTS

| | | |
|---|---|---|
| JP | 2013-30817 A | 2/2013 |
| JP | 2014096460 A | 5/2014 |
| JP | 2014096539 A | 5/2014 |
| WO | 2011/033625 A1 | 3/2011 |
| WO | 2016/143574 A1 | 9/2016 |

OTHER PUBLICATIONS

English Abstract of JP 2014096539, dated May 22, 2014.
English Abstract of JP 2014096460, dated May 22, 2014.
English Abstract of JP 2007134700, dated May 31, 2007.
English Abstract of WO 2016/143574, dated Sep. 15, 2016.
English Abstract of JP 2013-30817, dated Feb. 7, 2013.
English Abstract of WO 2011/033625, dated Mar. 24, 2011.
English Abstract of JP 2007-214569, dated Aug. 23, 2007.
International Preliminary Report on Patentability for PCT/JP2016/055992 dated Sep. 21, 2017.
Kumakura K et al: "Minority carrier diffusion length in GaN: Dislocation density and doping concentration dependence", Applied Physics Letters, vol. 86, No. 5, 2005, pp. 52105-1 to 52105-3.

* cited by examiner

GROUP III NITRIDE SEMICONDUCTOR LUMINESCENCE ELEMENT

This application is a U.S. national stage application of PCT/JP2016/055992 filed on 29 Feb. 2016 and claims priority to Japanese patent document 2015-044744 filed on 6 Mar. 2015, the entireties of which are incorporated herein by reference.

TECHNICAL FIELD

The present invention relates to a group III nitride semiconductor luminescence element comprising a luminescence peak wavelength of ultraviolet ray. Particularly, the present invention relates to a technology of preventing the deterioration of the element caused by the current concentration to an edge part of a mesa structure of the luminescence element. Also, the present invention relates to a wafer comprising the constitution of said luminescence element.

BACKGROUND OF THE INVENTION

FIG. 7A and FIG. 7B show typical schematic structures of a group III nitride semiconductor luminescence element 20. FIG. 7A is a top view of the element, and FIG. 7B shows the cross section at A-A line of FIG. 7A. The group III nitride semiconductor luminescence element 20 is formed with a laminate (hereinafter, this may be referred as a "laminate semiconductor layer") comprising on one surface side of a substrate 11, a n-type layer 12, an active layer 13, and a p-type layer 14; and having a mesa structure 15 at a part of the laminate semiconductor layer thereof is known. The mesa structure 15 is formed by forming the laminate semiconductor layer comprising on one surface side of the substrate 11, the n-type layer 12, the active layer 13, and the p-type layer, and then removing a part of the laminate structure by etching or so to expose a part of the n-type layer 12. A part having a plateau shape (also called as a mesa) including the active layer 13 and the p-type layer is maintained; thereby the mesa structure 15 is formed (see the patent document 1). An n-type electrode 16 is formed on the exposed surface of the n-type layer 12, and a p-type electrode 17 is formed at the surface of the p-type layer 14.

For the group III nitride semiconductor luminescence element 20 comprising the mesa structure 15, when the driving voltage is applied to the p-type electrode 17 on the p-type layer and the n-electrode 16 on the n-type layer, the current runs the pathway having a low resistance (usually the shortest pathway) between the p-type electrode and the n-type electrode, thus the current runs by concentrating at near the edge part of the mesa structure 15 (hereinafter, it will be called as a "mesa edge") close to the n-type electrode and the p-type electrode. As a result, the current does not flow uniformly to the active layer 13, thus uneven luminescence occurs. Also, since the current concentrates at the mesa edge, a local heat generation occurs near the mesa edge. As a result, the deterioration of the luminescence element easily proceeds, and causes the decrease in the luminescence efficiency, increase in the driving voltage, and decrease in the reliability.

The patent document 2 discloses the ultraviolet semiconductor luminescence element wherein the high resistance layer having higher resistance than the p-type layer or p-electrode is formed in a shape along the shape of p-type layer side at closer side to the n-type electrode on the surface of the p-type layer. As disclosed in the patent document 2, when the high resistance layer is formed on the p-type layer close to the mesa edge, the current can be suppressed from concentrating near the mesa edge. However, due to the presence of the high resistance layer, the resistance between the p-type electrode and the semiconductor layer becomes larger, and the driving voltage becomes larger as well.

The patent document 3 discloses the semiconductor luminescence element wherein a trench is formed between the p-electrode and the n-electrode. By forming the trench, the length of the current pathway running between the p-electrode and the n-electrode is suppressed from varying, thereby the current is suppressed from concentrating to a particular part. However, in order to make the varying of the length of the current pathway sufficiently small, the depth of the trench must be deep. If the trench is made deep, the current pathway as a whole becomes longer, and the resistance becomes large, and the driving voltage also becomes large.

Further, due to various designs of the recent devices, the luminescence element having various shapes and constitution has been proposed, and also there are variety of mesa structures and designs of the electrode shapes. The art of forming the high resistance layer and the trench as mentioned in the above will increase the steps for producing the luminescence element, hence it has become difficult to correspond to the various mesa structure and electrodes shape in a timely manner.

Further particularly, the deep ultraviolet ray luminescence element having the luminescence peak wavelength of 200 to 350 nm is difficult to produce; hence the yield tends to easily decrease. Further, when the current is running, the current tends to concentrate near the mesa edge, thus such part may deteriorate due to the heat or so and the quality tends to be damaged. Thus, the development of the luminescence element capable of suppressing the deterioration caused by the current concentration near the mesa edge was in demand.

PRIOR ART

Patent Document

Patent document 1: JP Patent Application Laid Open No. 2014-96539
Patent document 2: JP Patent Application Laid Open No. 2014-96460
Patent document 3: JP Patent Application Laid Open No. 2007-134700

The object of the present invention is to provide the group III nitride semiconductor luminescence element capable to suppress the deterioration of the luminescence element caused by the current flowing between the p-electrode and the n-electrode concentrating near the mesa edge, without increasing the steps for producing the luminescence element, and without excessively increasing the driving voltage.

The present inventors have speculated that the above object can be attained by regulating the structure of the p-electrode, and have carried out keen examination. Further, the present inventors have found that the above object can be attained by forming the p-electrode by taking certain distance from the edge part of the mesa structure, particularly at the part where the mesa structure is projecting out; thereby the present invention was attained.

That is, the first invention is a group III nitride semiconductor luminescence element having a mesa structure comprising a n-type layer, a p-type layer, an active layer provided between the n-type layer and the p-type layer, a n-electrode provided on said n-type layer, and a p-electrode provided on said p-type layer; wherein from a top view of said group III nitride semiconductor luminescence element, a distance between a part of an edge of the mesa structure and an outer peripheral of said p-electrode is ⅓ or more of a diffusion length $L_s$, or from a top view of said group III nitride semiconductor luminescence element, a distance between a part of the edge of the mesa structure and the outer peripheral of said p-electrode is 12 μm or more. As the production technology of the present luminescence element, the object of the present invention can be sufficiently attained, when the distance between the part of the mesa edge and the outer peripheral of the p-electrode is 12 μm or more.

The second invention is the group III nitride semiconductor luminescence element as set forth in the first invention, wherein the distance between a projection part of the edge of the mesa structure and the outer peripheral of said p-electrode is ⅓ or more of the diffusion length $L_s$. The current tends to easily concentrate to the p-electrode part at the projection part of the mesa edge, thus the distance between the projection part of the mesa edge and said peripheral of the p-electrode is preferably within the above mentioned range.

The third invention is the group III nitride semiconductor luminescence element as set forth in the first invention, wherein the distance between a projection part of the edge of the mesa structure and the outer peripheral of said p-electrode is 12 μm or more.

The fourth invention is the group III nitride semiconductor luminescence element as set forth in first to third inventions, wherein the luminescence peak wavelength is 200 to 350 nm. The group III nitride semiconductor luminescence element having the luminescence peak wavelength of 200 to 350 nm is difficult to produce, and the improvement of the yield is strongly demanded, thus the present invention is suitable.

Further, the fifth invention is a wafer including the constitution of a group III nitride semiconductor luminescence element comprising a n-type layer, a p-type layer, an active layer provided between the n-type layer and the p-type layer, a n-electrode provided on said n-type layer, and a p-electrode provided on said p-type layer, wherein the constitution of said group III nitride semiconductor luminescence element is as set forth in said inventions 1 to 4.

In the present invention, when the group III nitride semiconductor luminescence element is viewed from the top, the distance between a part of the mesa edge and the outer peripheral of said p-electrode is set to predetermine value or more, thereby a p-electrode restricted area is provided near the edge part of the mesa structure. In this p-electrode restricted area, the ratio of the p-electrode formed is regulated to be low compared to the mesa part other than this area. By providing the p-electrode restricted area, the current running between the p-electrode and the n-electrode is suppressed from concentrating near the mesa edge without excessively increasing the driving voltage of the element. As a result, the group III nitride semiconductor luminescence element barely having the local deterioration in the mesa structure, and also barely having the uneven luminescence can be obtained because the current evenly runs in the active layer.

As a result, the quality damage caused by the current concentration near the mesa edge when running the current can be decreased, thus the yield of the luminescence element can be improved.

Particularly, the ultraviolet ray emitting element having the luminescence peak wavelength of 200 to 350 nm tends to have decreased yield because it is difficult to produce due to the influence of the composition of each layer, compared to the luminescence element having the luminescence peak wavelength longer than 350 nm, such as for example the luminescence element having the visible light range. The present invention can suppress the decrease of the yield which is caused by the local deterioration of the mesa structure; hence it is suited as the ultraviolet ray emitting element having the luminescence peak wavelength of 200 to 350 nm.

DETAILED DESCRIPTION OF INVENTION

Hereinafter, the embodiment of the present invention will be explained by referring to the figures. Note that, the luminescence element described in below is one example realizing the concept of the present invention, and the present invention is not limited thereto. For example, the size, material, shape and relative position or so of the element described in below is merely an example used for describing and the present invention is not to be limited thereto, unless mentioned otherwise. Note that, the size and the relationship of the position of the members shown in each figure may be exaggerated in order to make the description clear.

The luminescence range of the light emitted from the group III nitride semiconductor luminescence element of the present invention is not particularly limited. According to the present invention, regardless of the luminescence range, the decrease of the output caused by the deterioration due to the local current concentration in the mesa structure is suppressed, and the yield can be improved. Preferably, the present invention is used for the group III nitride semiconductor luminescence element comprising the luminescence peak wavelength in the visible light range or in the ultraviolet range. More preferably, the present invention is used for the group III nitride semiconductor luminescence element emitting the ultraviolet ray having the luminescence peak wavelength of 200 to 350 nm. Hereinafter, the group III nitride semiconductor luminescence element having the luminescence peak wavelength of 200 to 350 nm will be mainly discussed.

Figure 7A:
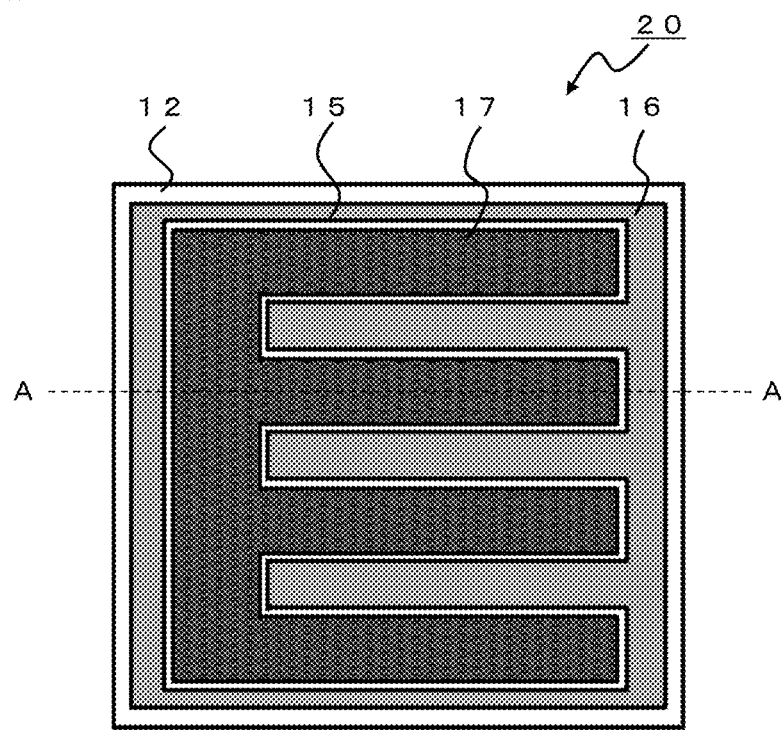
FIG. 7A shows the example of the typical group III nitride semiconductor luminescence element viewing from the top.
Figure 7B:
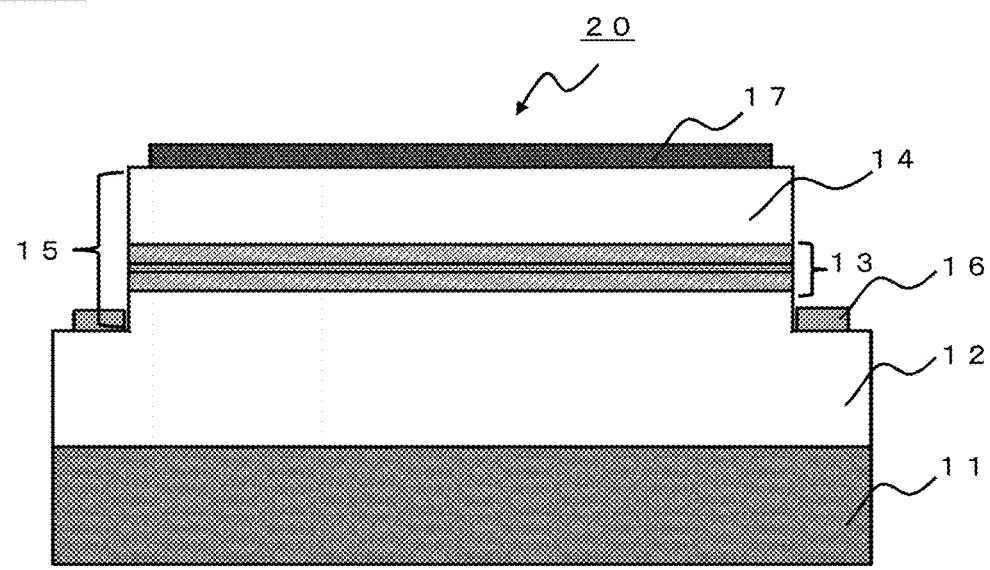
FIG. 7B shows the cross section of the typical group III nitride semiconductor luminescence element.

As shown in FIG. 7A and FIG. 7B, the typical group III nitride semiconductor luminescence element 20 comprises a n-electrode 16, and a p-electrode 17, a substrate 11, and a mesa structure 15 (a laminate semiconductor layer) including a n-type layer 12, an active layer 13 and p-type layer 14. Herein below, a non-limiting typical example thereof will be discussed.

Note that, a refraction factor, a transmission factor, and a reflection factor are based on the light having the wavelength of 265 nm. This is because DNA has a maximum absorbance near the wavelength of 265 nm, thus the light having the wavelength of 265 nm is most suited for sterilization, and hence will have high industrial applicability. Hereinafter, when simply referring to the refraction factor, the transmission factor, and the reflection factor, these are values with respect to the light having the wavelength of 265 nm.

<Substrate>

The substrate 11 allows the epitaxial growth of the group III nitride semiconductor luminescence element on the surface, and as long as it is a substrate allowing the ultraviolet ray to transmit through, it is not particularly limited. As the material used for the substrate 11, for example, sapphire, SiC (silicon carbide), AlN (aluminum nitride), Si (silicon) or so may be mentioned. Among these, an AlN single crystal substrate using c-plane as a principle plane is preferable.

The higher the transmission factor of the substrate 11 with respect to the light having the wavelength of 265 nm is, the better it is; and preferably it is 50% or more, and more preferably 60% or more. The upper limit of the transmission factor of the substrate 11 is preferably 100%; and from the point of the industrial production, it is 80%. The transmission factor of the translucent substrate can be regulated by the material, the thickness of the substrate, the crystallinity, and the impurity content.

The thickness of the substrate 11 is not particularly limited, but preferably it is 30 to 150 pun, and more preferably 50 to 100 µm. By setting the thickness of the substrate 11 within the above mentioned range, the transmission factor is improved, and the productivity is improved. The thickness of the substrate 11 only needs to satisfy the above mentioned range after the group In nitride semiconductor luminescence element is produced; and the lower face of the substrate may be ground or polished after laminating the laminate semiconductor layer or the electrode on the substrate, thereby the thickness of the substrate may be within the above mentioned range.

<Laminate Semiconductor Layer>

The laminate semiconductor layer (the main part of the element including the mesa structure 15 of FIG. 7) is formed on the substrate 11 as shown in FIG. 7B, and the n-type layer 12, the active layer 13 and the p-type layer 14 (the layer formed of a p-type clad layer and a p-type contact layer) are stacked in this order.

<N-Type Layer>

The n-type layer 12 is a group III nitride semiconductor constituted by $Al_xIn_yGa_zN$ (x, y, and z are rational number satisfying $0<x\leq1.0$, $0\leq y\leq0.1$, $0\leq z\leq1.0$, and $x+y+z=1.0$), and preferably it includes impurity.

The impurity is not particularly limited, but preferably Si, Ge, Sn or so may be mentioned. Among these, Si and Ge are preferable. The concentration of the impurity is $1.0\times10^{17}$ $cm^{-3}$ or more and $5.0\times10^{20}$ $cm^{-3}$ or less; and preferably $1.0\times10^{18}$ $cm^{-3}$ or more and $5.0\times10^{19}$ $cm^{-3}$ or less. By setting the concentration of the impurity within the above range, the crystallinity and the contact characteristic of the n-type layer improves. Such n-type layer may be produced by MOCVD method.

The refraction factor of the n-type layer is not particularly limited, but it is 1.5 to 3.0. The refraction factor may be regulated by the composition of the n-type layer.

The thickness of the n-type layer is 100 nm or more and 10000 nm or less, and preferably 500 nm or more and 3000 nm or less. By having the thickness of the n-type layer within the above range, the crystallinity and the conductivity of the n-type layer improves.

Note that, although it is not shown in FIG. 7, the group III nitride semiconductor luminescence element 20 may comprise a buffer layer including the group III nitride semiconductor having the composition same or similar to AlN or the above mentioned n-type layer, in between the substrate 11 and the n-type layer 12.

<Active Layer>

The active layer 13 is formed of the laminate structure comprising a quantum well layer constituted of $Al_xIn_yGa_zN$ (x, y, and z are rational number satisfying $0<x\leq1.0$, $0\leq y\leq0.1$, $0\leq z<1.0$, and $x+y+z=1.0$), and a barrier layer constituted of $Al_xIn_yGa_zN$ (x, y, and z are rational number satisfying $0<x\leq1.0$, $0\leq y\leq0.1$, $0\leq z<1.0$, and $x+y+z=1.0$) having larger band gap energy than said quantum well layer. The active layer may be a multiple quantum well layer structure, or it may be a single quantum well structure.

The thickness of the quantum well layer is 1 nm or more, preferably 2 nm or more, and the upper limit is 100 nm. The thickness of the barrier layer is 1 nm or more, preferably 2 nm or more, and the upper limit is 1 µm. Such active layer can be produced by MOCVD method.

<P-Type Layer>

The p-type layer is constituted from the p-type clad layer and the p-type contact layer. The p-type clad layer is a group III nitride semiconductor constituted by $Al_xIn_yGa_zN$ (x, y, and z are rational number satisfying $0<x\leq1.0$, $0\leq y\leq0.1$, $0\leq z<1.0$, and $x+y+z=1.0$), and preferably it includes impurity.

The impurity of the p-type clad layer is preferably Mg. The concentration of impurity in the p-type clad layer is $1.0\times10^{17}$ $cm^{-3}$ or more and $5.0\times10^{20}$ $cm^{-3}$ or less; and preferably $1.0\times10^{18}$ $cm^{-3}$ or more and $5.0\times10^{20}$ $cm^{-3}$ or less. The thickness of the p-type clad layer is 5 nm or more and 100 nm or less, and preferably 10 nm or more and 50 nm or less.

The p-type contact layer is a group III nitride semiconductor constituted by $Al_xIn_yGa_zN$ (x, y, and z are rational number satisfying $0<x\leq1.0$, $0\leq y\leq0.1$, $0<z\leq1.0$, and $x+y+z$ 1.0). Preferably, the p-type contact layer is constituted of GaN. By constituting the p-type contact layer by GaN, that is p-GaN layer, then the contact characteristic of the p-type contact layer can be improved. Also, the p-type contact layer preferably includes the impurity.

The impurity of the p-type contact layer is preferably Mg as similar to the p-type clad layer. The concentration of impurity in the p-type contact layer is $1.0\times10^{17}$ $cm^{-3}$ or more and 5.0×10²⁰ cm⁻³ or less; and preferably 1.0×10¹⁸ cm⁻³ or more and 5.0×10²⁰ cm⁻³ or less. The thickness of the p-type contact layer is 1 nm or more and 100 nm or less, and preferably 5 nm or more and 50 nm or less. By having the thickness of the p-type contact layer within the above mentioned range, the ultraviolet ray transmission characteristic and the contact characteristic of the p-type layer improves.

The transmission factor of the p-type layer, which is the transmission factor with respect to the light having the wavelength of 265 nm is preferably 50% or more, and more preferably 60% or more. The upper limit of the transmission factor is not particularly limited, but from the point of the production stability, it is 85%. By setting the transmission factor of the p-type layer with respect to the light having the wavelength of 265 nm within the above mentioned range, the light-extraction efficiency improves.

The transmission factor of the p-type layer 14 largely depends on the thickness and the composition of the p-type contact layer. When constituting the p-type contact layer with GaN (p-GaN layer), GaN has an absorption edge at the wavelength of 365 nm, thus if it is too thick, the light having the wavelength of 265 nm will barely transmit through. The relation between the thickness of the p-type contact layer and the transmission factor can be expressed by $T=\exp(-\alpha t)$, wherein "T" is the transmission factor, "$\alpha$" is the absorbance coefficient (cm⁻¹), and "t" is thickness (cm). The absorbance coefficient $\alpha$ of GaN at the wavelength of 265 nm is $1.8\times10^5$ (cm⁻¹). That is, the thinner the p-GaN layer is, the higher the transmission factor can be. However, if the p-GaN layer is too thin, the current does not sufficiently spread, thus the electric characteristic of the luminescence element may be poor.

However, when constituting the p-type contact layer with GaN (p-GaN layer), the thickness of the p-GaN layer is preferably 1 nm or more and 40 nm or less, preferably 10 nm or more and 30 nm or less. By having the thickness of the p-GaN layer within the above mentioned range, the current will sufficiently spread in the p-type contact layer, and the electric characteristic of the luminescence element improves, and also the ultraviolet ray transmission characteristic of the p-type layer improves. Such p-type layer can be produced by MOCVD method.

<N-Electrode>

The n-electrode 16 is formed on the exposed face of the n-type layer 12. The exposed face of the n-type layer is formed by the means of etching or so. Due to the forming of the exposed face of the n-type layer, the laminate semiconductor layer remains in a plateau shape; thereby the mesa structure 15 is formed. The n-electrode on the n-type layer is formed at the lower part along the lower mesa edge of the mesa structure, however it may be a structure wherein a space is slightly taken from the lower mesa edge of the mesa structure, and the n-type layer 12 is exposed between the mesa structure 15 and the n-electrode 16.

From the top view of the group III nitride semiconductor luminescence element 20, the n-electrode 16 may be formed so as to surround the entire p-electrode 17 along the mesa edge, or the n-electrode may surround part of the p-electrode. Alternatively, the p-electrode may be formed so as to surround the n-electrode.

As the method of etching, for example a dry etching such as reactive ion etching, and inductive coupling plasma etching or so may be mentioned. After forming the exposed face of the n-type layer 12, in order to remove the damage by the etching, preferably the exposed face is subjected to a surface treatment by acid or alkali. Then, the n-electrode 16 comprising an ohmic characteristic is formed to the exposed face of the n-type layer.

The n-electrode can be formed by a lift-off method. As the lift-off method, a photoresist is coated to the face where the electrode is to be formed, and the ultraviolet ray is irradiated using the UV exposure machine having a photomask. Then, it is immersed in the developing solution to dissolve the photoresist exposed to the light thereby the desired pattern is formed. Then, an electrode metal is deposited on the photoresist, and the photo-resist is dissolved by a stripping solution thereby the electrode metal is formed. Also, as other method of forming, the electrode metal film is formed on the electrode forming face, and the photoresist is coated, then the photoresist is formed via the steps of light exposing and developing. Then, the dry etching or wet etching is carried out using the photo-resist as a mask to form the electrode metal, and dissolving the photo-resist by stripping solution. The lift-off method is preferable since the steps are relatively simple.

As the method for depositing the n-electrode metal, for example, a chemical vapor phase method such as the vacuum evaporation and spattering or so may be mentioned. Particularly, the vacuum evaporation method is preferable as the impurity included in the electrode metal can be removed. The material used for the n-electrode can be selected from the known materials. For example, Ti, Al, Rh, Cr, In, Ni, Pt and Au or so may be mentioned. Among these, Ti, Al, Rh, Cr, Ni and Au are preferable. Particularly, the combination of Ti, Al and Au are preferable since the ohmic characteristic and the reflection factor can be improved. The n-electrode may be single layer or multiple layer structure comprising alloy or oxides of these metals.

The thickness of the n-electrode is not particularly limited, but considering the stability of the production, it is preferably 2 nm or more and the upper limit is 2 μm.

Figure 1A:
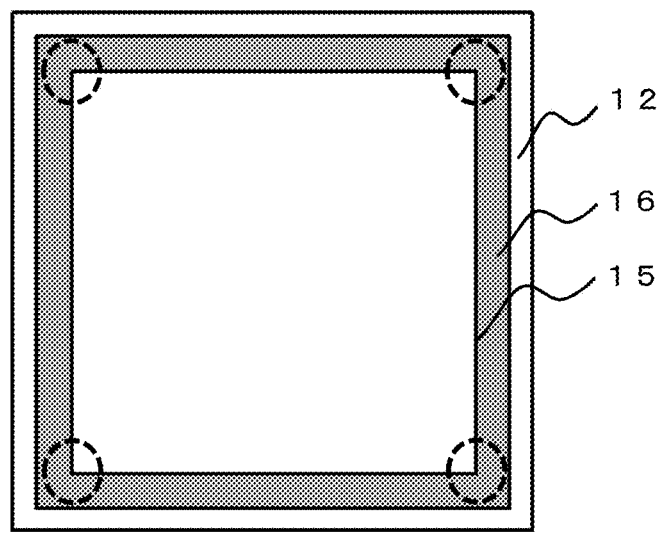
FIG. 1A shows an example of the group III nitride semiconductor luminescence element viewing from the top.
Figure 1B:
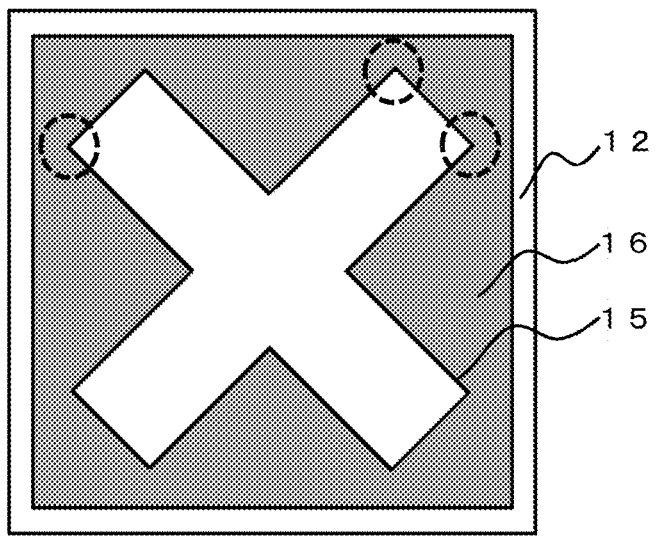
FIG. 1B shows an example of the group III nitride semiconductor luminescence element viewing from the top.
Figure 1C:
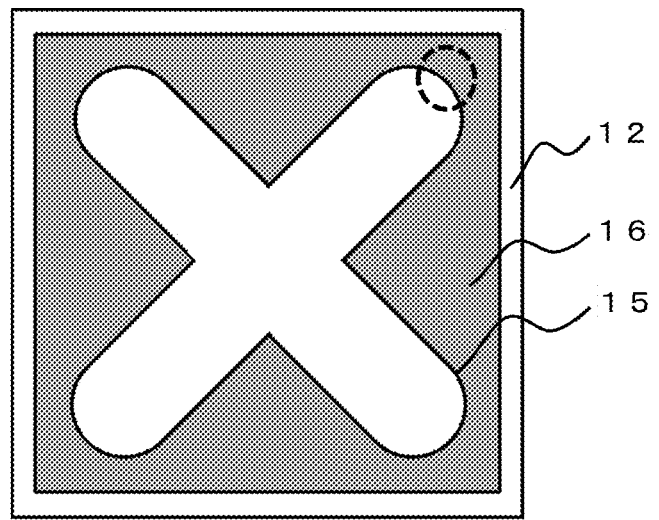
FIG. 1C shows an example of the group III nitride semiconductor luminescence element viewing from the top.
Figure 1D:
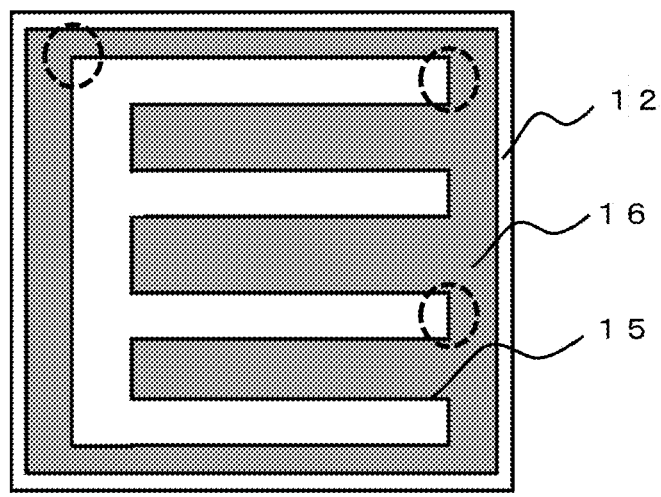
FIG. 1D shows an example of the group III nitride semiconductor luminescence element viewing from the top.
Figure 1E:
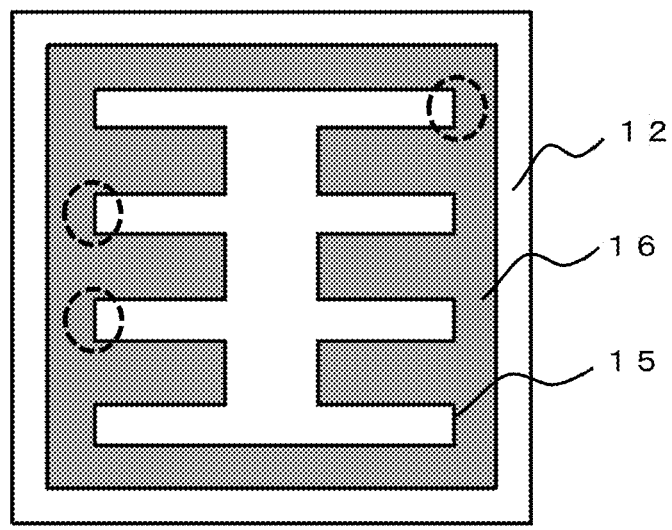
FIG. 1E shows an example of the group III nitride semiconductor luminescence element viewing from the top.
Figure 1F:
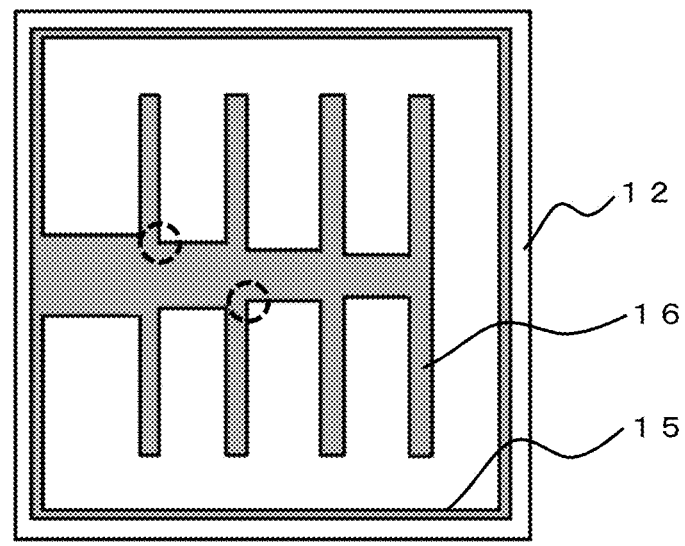
FIG. 1F shows an example of the group III nitride semiconductor luminescence element viewing from the top.
Figure 1G:
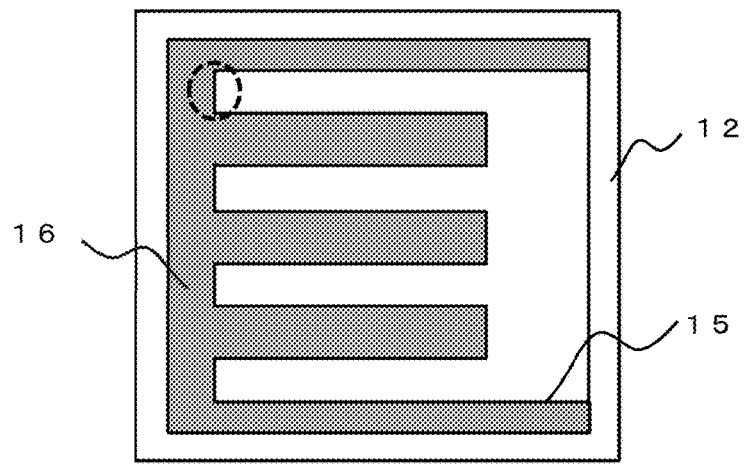
FIG. 1G shows an example of the group III nitride semiconductor luminescence element viewing from the top.

As shown in FIG. 1, the type of the n-electrode is not particularly limited, and it may be formed so as to surround the entire mesa structure 15 along the mesa edge (FIG. 1A to FIG. 1F), or it may be formed so that the n-electrode surrounds part of the mesa structure 15 (FIG. 1G). In this case, the n-electrode may be formed so as to surround the p-electrode (FIG. 1A to FIG. 1E and FIG. 1G), or it may be other way around and the p-electrode may be formed so as to surround the n-electrode (FIG. 1F).

As shown in FIG. 1F, in case the n-electrode comprises the linear part, the width of the n-electrode is not particularly limited, but usually it is 5 to 100 μm or so, and preferably 10 to 50 μm. In this case, the width of the n-electrode may not be uniform. For example, the part having a wide width and narrow width may coexist. In this case, the average width of the n-electrode may be within the above mentioned range of width.

In order to improve the contact characteristic with the n-type layer, preferably after depositing the n-electrode metal, a heat treatment is carried out at 300° C. to 1100° C. for 30 seconds to 3 minutes. The temperature and time of the heat treatment can be selected from the most suitable condition depending on the metal type and the thickness of the n-electrode.

<P-Electrode>

The p-electrode 17 is formed on the p-type layer 14 of the mesa structure 15. The type of the p-electrode 17, that is the shape and the size of the p-electrode 17 are about the same as the mesa structure 15. In the present invention, the position of the p-electrode 17 formed is set based on the predetermined rule related to the shape of the mesa structure 15. Thereby, the current which tends to easily concentrate near the mesa edge is dispersed, and the current is suppressed from concentrating to the mesa edge. The rule of forming the p-electrode will be discussed in following, but first a non-limiting typical example regarding the property of the general p-electrode and the method of forming thereof will be explained.

The p-electrode 17 may comprise an ultraviolet ray transmission property. The transmission factor of the p-electrode with respect to the light having the wavelength of 265 nm is preferably 60% or more, and more preferably 70% or more. The upper limit of the transmission factor is not particularly limited, and preferably it is 100%, but industrially it is 90%. Note that, the transmission factor of the wavelength with respect to the light having the wavelength of 265 nm is 60% or more, then sufficient transmission property can be obtained within the range of the wavelength of 200 to 350 nm.

The p-electrode is preferably formed by the lift-off method as similar to the n-electrode. The metal material used for the p-electrode can be selected from the known materials. For example, Ni, Cr, Au, Mg, Zn, Pd and Pt or so may be mentioned. Among these, the combination of Ni and Au is preferable. The p-electrode may be single layer or multiple layer structure comprising alloy or oxides of these metals.

The shape of the p-electrode is not particularly limited, but as already mentioned, it is formed to have about the same shape but slightly smaller than the mesa structure 15. Therefore, the shape of the p-electrode may be a rectangular parallelepiped shape which is almost the same shape as the mesa structure 15 as shown in FIG. 1A, or it may be a cross shape as shown in FIGS. 1B and 1C, or it may be a comb shape as shown in FIG. 1D to 1G. The width of the p-electrode is not particularly limited, but in case of the shape similar to the mesa structure 15 as shown in FIG. 1B to FIG. 1G, then usually the width is 5 to 100 µm or so, and preferably 10 to 50 µm or so. The width of the p-electrode may not be uniform. For example, the part having a wide width and narrow width may coexist. In this case, the average width of the p-electrode may be within the above mentioned range.

As the method of depositing the p-electrode metal, as similar to the method of forming the n-electrode, for example the vacuum evaporation, spattering and chemical vapor phase method or so may be mentioned. Particularly, the vacuum evaporation is preferable as the impurity in the electrode metal can be removed. In order to improve the contact characteristic with the p-type layer, preferably after depositing the p-electrode metal, a heat treatment is carried out at 200° C. to 800° C. for 30 seconds to 3 minutes. The temperature and time of the heat treatment can be selected from the most suitable condition depending on the metal type and the thickness of the p-electrode.

<Type of p-Electrode>

As shown in FIG. 7, the p-electrode 17 is formed almost the same as the mesa structure 15, on the p-electrode layer 14 positioned at the upper part of the mesa structure 15 having a plateau shape. The n-electrode 16 is formed at the lower part viewing from the mesa structure. Regarding the conductivity between the n-electrode 16 and the p-electrode 17, the pathway with lower resistance will have a priority, thus the current tends to concentrate to area near the edge part of the mesa structure 15 having the shortest distance between the n-electrode and the p-electrode.

Thus, in the present invention, in order to avoid the current concentration at the mesa edge, a certain distance is provided between the mesa edge and the p-electrode. That is, in the first invention, when viewing the group III nitride semiconductor luminescence element from the top, the distance between a part of the mesa edge and an outer peripheral of said p-electrode is ⅓ or more of a diffusion length $L_s$. That is, between the p-electrode and a part of the mesa edge, the p-electrode restricted area exists where the electrode is restricted from forming. In other words, the present invention comprises the p-electrode restricted area of which the width is ⅓ or more of a diffusion length l, at a part near the edge part of the mesa structure.

Here, "mesa edge" refers to the outline of the mesa structure 15, and to the edge part of the mesa structure from the top view, further it is shown as the outer peripheral (outline) of the p-type layer 14. The mesa structure is formed by etching the laminate semiconductor layer almost perpendicularly, but it does not necessarily have to be completely perpendicular; and it may be formed in a taper shape from the top to the bottom of the mesa structure. In case the area of the top part of the mesa structure is smaller than the area of the bottom part of the mesa structure, the taper part is observed from the top view. When the area of the top part of the mesa structure is larger than the area of the bottom part of the mesa structure, then the taper part is formed in an overhang form thus it is difficult to observe from the top view.

In the below discussion, the mesa edge is the edge part of the mesa structure from the top view, also defined as the outer peripheral (outline) of the p-type layer 14 positioned at the upper most layer of the mesa structure, and it does not include the taper part.

Also, the distance between the mesa edge and the outer peripheral of the p-electrode refers to the shortest pathway to the outline of the p-electrode from the arbitrarily selected mesa edge, when viewing from the top.

"A part" of the mesa edge means that not all of the mesa edge necessarily needs to have a distance of ⅓ or more of a diffusion length $L_s$ from the p-electrode, and in some part, the mesa edge and the outline of the p-electrode may be closely positioned in a distance of ⅓ or less. That is, as long as the mesa edge and the p-electrode is spaced a part by a predetermined distance at the part where the current concentration easily occurs, then the current concentration which causes the element malfunction can be solved. On the other hand, at the part where the current concentration barely occurs, the mesa edge and the outline of the p-electrode may be close to each other, and from the top view, the p-electrode and the n-electrode may be close to each other in a distance less than ⅓ of a diffusion length $L_s$.

The mesa edge where the current concentration tends to occur is surrounded by the n-electrode. Such mesa edge has various shape depending on the outline shape of the mesa structure, however it exist usually in the ratio of 5 to 30% with respect to the entire peripheral of the mesa structure. However, among the mesa edges, for the mesa edges surrounded by the n-electrode, in the present invention, certain distance or more is taken between the mesa edge and the p-electrode; thereby the p-electrode restricted area is provided.

As such, by taking a distance between the mesa edge and the p-electrode, the current will not run to this part, thus the current concentration at the area near the edge part of the mesa structure 15 can be suppressed. If the distance between the outer peripheral of the p-electrode is ⅓ or more of a diffusion length $L_s$ for all mesa edges, then the driving voltage of the group MI nitride semiconductor luminescence element rises, and the luminescence efficiency may decline.

Therefore, in the present invention, particularly at the part where the current tends to concentrate, the distance between mesa edge and the p-electrode may be predetermined value or more.

According to the examination by the present inventors, if the distance between a part of the mesa edge and the outer peripheral of the p-electrode is ⅓ or more of a diffusion length $L_s$, the current concentration can be effectively suppressed without excessively increasing the driving voltage, and the yield of the luminescence element can be improved.

When the current runs the luminescence element, the electron will move from the n-layer to the p-layer. Considering the movement of the electron to the p-type layer, the diffusion length $L_s$ refers to the distance of which the most of the electron can scatter in the n-type layer towards the mesa edge from the end of the n-electrode closer to the mesa edge. The conventional art has not regulated the distance between a part of the mesa edge and the outer peripheral of the p-electrode based on the diffusion length $L_s$. The present inventors have found that a superior effect can be exhibited by making the distance to ⅓ or more of the diffusion length $L_s$, thereby the present invention was achieved.

Note that the diffusion length $L_s$ is defined by the below equation.

$$L_s = \{(\rho_c + \rho_p t_p) t_n / \rho_n\}^{1/2}$$

Here, $\rho_c$: a contact resistance between p-electrode/p-type layer, and between n-electrode/n-type layer, $\rho_p$: a specific resistance of the p-layer, $\rho_n$: a specific resistance of the n-layer, $t_p$: thickness of p-type layer, and $t_n$: thickness of n-type layer.

(Method of Measuring the Contact Resistance)

In the present invention, the contact resistance is measured by TLM (Transfer Length Method). First, by the same method as the production of the luminescence element, p-electrode type comprising the electrode non-formed area having a donut shape is formed on the p-GaN surface (the distance between the electrodes: 5, 10, 20, 40, 60, 80, 100 μm). Using the obtained electrode pattern, the resistance between electrode distances is measured, thereby the contact resistance between the p-electrode/p-type layer and the n-electrode/n-type layer is calculated from the relation between the resistance and the distance between the electrodes.

(Method of Measuring the Specific Resistance)

First, in the present invention, using the same method as the production of the luminescence element, to the surface of four corners of p-GaN, p-AlGaN and n-AlGaN of a square having 7 mm on one side, four p-electrodes and n-electrodes of a circular shape having diameter of 1.5 mm are formed respectively. For the obtained samples, a HALL effect measurement is carried out, thereby the specific resistance of the p-type layer (p-GaN, p-AlGaN) and n-type layer (n-AlGaN) are calculated.

In the first invention, the distance between a part of the mesa edge and the outer peripheral of the p-electrode is set ⅓ or more of the diffusion length $L_s$, thereby the yield of the ultraviolet ray emitting element can be improved. Among these, in order to suppress the increase of the driving voltage and to efficiently improve the yield, the distance between a part of the mesa edge and the outer peripheral of the p-electrode is preferably ⅓ or more of the diffusion length $L_s$ and 1.2 times or less of the diffusion length $L_s$, and more preferably ⅓ or more of the diffusion length $L_s$ and 1.0 times or less of the diffusion length $L_s$.

As the diffusion length $L_s$ does not depend on the electrode width, it is used as the standard for the device design to suppress the current concentration even in case the element becomes compact and the electrode becomes narrower.

Also, in the first invention, the distance between a part of the mesa edge and the outer peripheral of the p-electrode is ⅓ or more of the diffusion length $L_s$, but for the technology at the point of the present invention, the distance of 12 μm or more between a part of the mesa edge and the outer peripheral of the p-electrode should be sufficient (the second invention). Further, in order to suppress the increase of the driving voltage and to efficiently improve the yield, the distance between a part of the mesa edge and the outer peripheral of the p-electrode is preferably 20 to 80 μm, more preferably 15 to 80 μm, even more preferably 15 to 80 μm, and even further preferably 20 to 40 μm. This distance is a sufficient value for the current (2015) element design. However, in case the element is further downsized, and the electrode becomes narrower, the distance between a part of the mesa edge and the outer peripheral of the p-electrode may be impossible to have 12 μm or more in some case. In such case, as in the first invention, the distance between a part of the mesa edge and the outer peripheral of the p-electrode is set based on the diffusion length $L_s$.

According to the second invention, the p-electrode restricted area, where the electrode is restricted from forming, is present between the part of the mesa edge and the p-electrode. In other words, the present invention comprises the p-electrode restricted area having the width of 12 μm or more at the part near the edge part of the mesa structure.

In the first and the second invention, when the luminescence element is viewed from the top, the distance between a part of the mesa edge and the outer peripheral of the p-electrode is set to a predetermined value or more. The intention of describing "A part" of the mesa edge is because it is sufficient if the distance between the mesa edge and the outer peripheral of the p-electrode is predetermined value or more mainly at the part where the current tends to concentrate.

The part where the current tends to concentrate refers to the part where the p-electrode is projecting out to the area of the n-electrode forming area. At this part, the p-electrode is surrounded by the n-electrode, thus the electron from the n-electrode tends to concentrate. As a result, such part will emit stronger light, but also be damaged and the deterioration tends easily occur. The p-electrode 17 is formed on the mesa structure 15 in a about the same shape as the mesa structure. Therefore, at the part where the mesa structure 15 is projecting out to the area formed with the n-electrode, the current concentration at the mesa structure edge part which easily deteriorates could be suppressed by taking predetermined distance or more between the mesa edge and the p-electrode.

Therefore, in the third invention, the distance between the projection part of the mesa edge and the outer peripheral of the p-electrode is ⅓ or more of the diffusion length $L_s$, preferably ⅓ or more of the diffusion length $L_s$ and 1.2 times or less of the diffusion length $L_s$, and more preferably ⅓ or more of the diffusion length $L_s$ and 1.0 times or less of the diffusion length $L_s$. In the fourth invention, the distance between the projection part of the mesa edge and the outer peripheral of the p-electrode is 12 μm or more, preferably 12 to 80 μm, more preferably 15 to 80 μm, even more preferably 20 to 80 μm, and further more preferably 20 to 40 μm. That is, in the third and fourth inventions, the p-electrode restricted area is provided near the projection part of the mesa edge.

Here, "the projection part of the mesa edge" refers to the part where the outline of the mesa structure 15 is projecting out to the n-electrode forming area, when viewed from the top. If the p-electrode is formed at this part, the electron from the n-electrode surrounding the p-electrode will concentrate to the p-electrode, thus the semiconductor layer right below the p-electrode easily deteriorates. Therefore, by setting the distance from the projection part of the mesa edge to the p-electrode to a predetermined value or more, the current concentration is suppressed, and the deterioration of the element can be reduced.

The outline of the mesa structure 15 varies depending on the type of the electrode of the element design. Therefore, "the projection part of the mesa edge" is difficult to define. Hence, non-limiting examples regarding the outline of the mesa structure 15 and the type of the n-electrode viewing from the top of the element are shown in FIG. 1, and the "the projection part of the mesa edge" where the current easily concentrates are shown by a circle of broken line. Note that, from the top view in FIG. 1, the n-electrode 12 and the mesa structure 15 are in contact, but at the cross section shown in FIG. 7B, a taper part of the mesa structure or the exposed n-type layer may be present between the edge part of the mesa structure 15 and the n-electrode. For the group III nitride semiconductor luminescence element according to the third and fourth inventions, the p-electrode is formed by taking a predetermined distance from "the projection part of the mesa edge", and the p-electrode restricted area is formed where the p-electrode formation is limited at the area less than the predetermined distance.

FIG. 1A shows the element structure wherein the mesa structure 15 having the rectangular parallelepiped shape is when viewed from the top. In this structure, each corner point of the rectangular parallelepiped shape project out to the area where the n-electrode is formed, and if the p-electrode is formed to this part, the current tends to concentrate to the mesa part right below the p-electrode.

FIG. 1B shows the cross shape mesa structure 15. In this structure, each corner point of the cross projects out to the n-electrode forming area.

FIG. 1C shows the mesa structure 15 having a cross shape of which the edge part is round. In this structure, the edge part of the cross projects out to the n-electrode forming area.

FIG. 1D shows the mesa structure 15 having the comb shape. In this structure, each tip of the comb and the corner point of the rectangular parallelepiped shape project out to the n-electrode forming area.

FIG. 1E is a modified example of FIG. 1D, and it shows the structure where the electrode extends in a comb teeth shape from the backbone of the comb.

FIG. 1F shows the structure wherein the n-electrode has a linear part, and further the electrode also extends from the backbone of comb which is forming the n-electrode.

FIG. 1G shows the n-electrode of comb shape surrounding the mesa structure having a comb shape.

In the constitutions shown in the figures, each tip of the comb and the corner point of the rectangular parallelepiped shape which are the p-electrode projects out to the n-electrode forming area. In the group III nitride semiconductor luminescence element according to the third and fourth inventions, for the type of the mesa structure having the constitution shown in the figures or having the similar constitution thereof does not have the p-electrode at the area less than the predetermined distance from the center of the circle showing the "the projection part of the mesa edge".

Also, "the projection part of the mesa edge" can be also defined as the mesa part where the n-electrode exists too much in the surrounding, when viewing the group III nitride semiconductor luminescence element from the top. Therefore, in order to determine whether "certain point" of the mesa edge corresponds to "the projection part of the mesa edge", the area of the n-electrode existing around said "certain point" may be considered. Specifically, using "the certain point" as subject to be determined as a center, a circle having a predetermine radius is drawn (hereinafter, this may be referred as "the reference circle"), when the area of the n-electrode present in the circle is large, then this means that the ratio of said "certain point" surrounded by the n-electrode is high. Alternatively, using "the certain point" as subject to be determined as a center, a circle having a predetermine radius is drawn, when the area of the mesa part (including the p-electrode) is small, then this means that the ratio of said "certain point" surrounded by the n-electrode is high.

From this point of view, in order to determine whether "certain point" of the mesa edge corresponds to "the projection part of the mesa edge", the following evaluation parameter is proposed which uses the area of the n-electrode and the mesa part (including the p-electrode and the p-type layer) in the predetermined circle, and using the "certain point" of the mesa edge as the center.

Evaluation parameter=($n$-electrode area/mesa structure area)×100%

The larger the parameter is, the higher the ratio of "the certain point" surrounded by the n-electrode is, and will be determined as positioned in "the projection part of the mesa edge".

The radius of the reference circle only needs to be about the size so that the circle and other mesa edge does not contact. However, if the circle is too small, the taper part between the mesa edge and the n-electrode, and the area of the exposed n-type layer will be over calculated, thus the circle needs to have a certain size or more. That is, if the reference circle at the mesa edge is too small, the area of the taper part of the mesa part, the area of the exposed n-type layer will be over calculated in the reference circle, thus the total area of the mesa part (including the p-electrode) relatively decreases, and the evaluation cannot be done appropriately.

Therefore, using the arbitrary point (the point subjected to the evaluation) on the mesa edge as the center point, the circle having the radius $r_n$ which gradually becomes larger is drawn. When the radius of the circle is small, the relative ratio of the area of the taper part and the area of the n-electrode is large, and as the circle becomes larger, the relative ratio thereof becomes smaller, hence the area of the mesa part (including the p-electrode) and the n-electrode can be evaluated appropriately. Therefore, the radius of the circle wherein the total ratio of the mesa part (including the p-electrode) and the n-electrode in the circle is 80% with respect to the entire area of circle is preferably the radius of the reference circle. Note that, the radius of the reference circle does not have to be large unless the reference circle contacts with other mesa edge.

Figure 2:
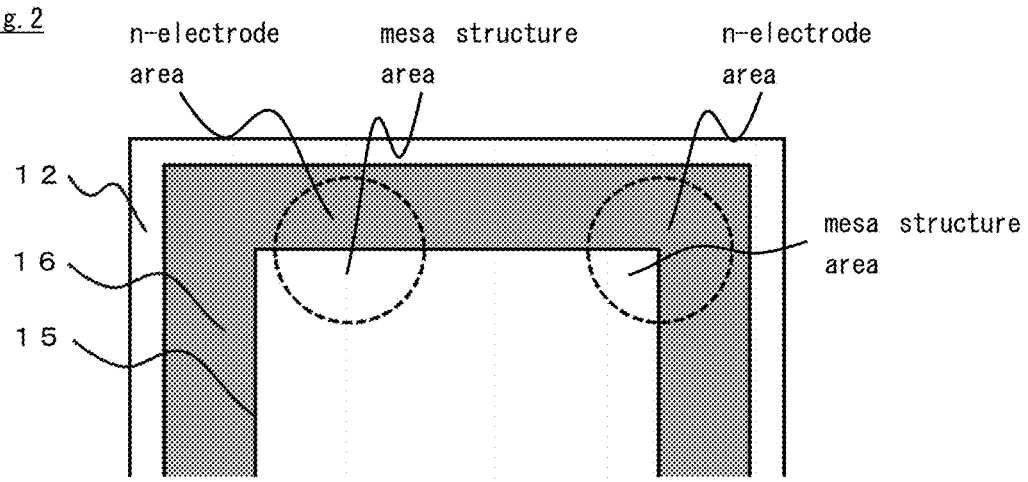
FIG. 2 shows the method of determining "the projection part of the mesa edge" using a reference-circle.

The method of determining "the projection part of the mesa edge" using the reference circle will be explained by referring to FIG. 2. When the reference circle is drawn by using a certain point on the mesa edge as the center, the mesa part (p-electrode), the n-type layer, and the n-electrode are present in the reference circle, and the taper part of the mesa structure may be observed from the top view. In this circle, the above mentioned evaluation parameter is calculated from the area of the mesa part, the area of the electrode and the entire area of the circle. In FIG. 2, the p-electrode is not shown. The p-electrode on the mesa structure 15 has the same shape as the mesa part, or it may be smaller than the mesa part.

Figure 3:
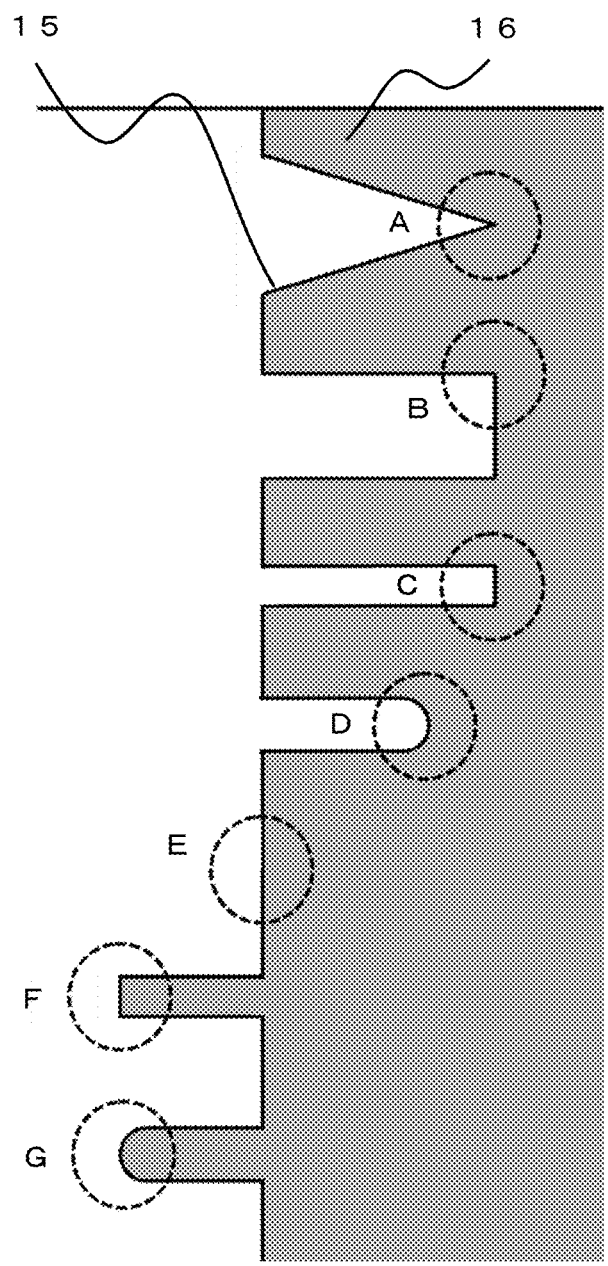
FIG. 3 shows various shape of the mesa edge.

In FIG. 3, the mesa edge having various outline are schematically shown when viewing the n-electrode from the top. Note that, in the FIG. 3, the area of the exposed n-type layer and the taper part between the electrodes are small, thus it is not shown in the figure. Also, the p-electrode has a same shape as the mesa part but slightly smaller, and the area of the p-electrode is included in the area of the mesa part, thus it is not shown in the figure.

As shown in type "A", when the mesa edge having an acute angle protrudes out to the n-electrode forming area, the area of the mesa part in the reference circle is small, and the area of the n-electrode is large. That is, the evaluation parameter becomes large; hence a current easily concentrates at this part of the p-electrode.

As shown in type "B", in case the mesa edge is perpendicular, the area of the mesa part in the reference circle is smaller than the area of the n-electrode. That is, the evaluation parameter is smaller than in case of type "A", but the area of n-electrode is too large, and a current easily concentrates at this part of the p-electrode.

As shown in type "C", in case the mesa structure is narrow, the area of the mesa part in the reference circle is smaller than the area of the n-electrode. That is, the area of n-electrode is too large, and a current easily concentrates at this part of the p-electrode.

As shown in type "D", in case the mesa structure shows a convex arc shape towards the n-electrode side, the area of the mesa part in the reference circle is smaller than the area of the n-electrode. That is, the area of n-electrode is too large, and a current easily concentrates at this part of the p-electrode.

As shown in type "E", in case the outline of the mesa structure is a straight line, the area of the mesa part in the reference circle is about the same as the area of the n-electrode. That is, the evaluation parameter is about 100%. The current concentration barely occurs at this part of the p-electrode.

As shown in type "F", in case the mesa structure surrounds the n-electrode, the area of the mesa part in the reference circle is larger than the area of the n-electrode. That is, the evaluation parameter is less than 100%. The current concentration at this part of the p-electrode barely occurs even less than in case of the type "E".

As shown in type "G", in case the n-electrode forming area shows the convex arc shape towards the mesa structure side, then the area of the mesa structure in the reference circle is larger than the area of the n-electrode. That is, the evaluation parameter is less than 100%. The current concentration barely occurs at this part of the p-electrode.

As clear from the above, in the present invention, when the area of the n-electrode is large with respect to the area of the mesa part such as in type "A" to "D", the p-electrode is not provided near said mesa edge, and will have p-electrode restricted area. That is, the area near the mesa edge having large evaluation parameter is the p-electrode restricted area.

Therefore, the preferable embodiment of the present invention is as shown in below.

The reference circle is drawn by taking the arbitrary point on the mesa edge as the center point. In case the evaluation parameter calculated from the area of each part in the reference circle exceeds 100%, the center of said reference circle is determined as positioned at "the projection part of the mesa edge". When it is determined as positioned at the projection part of the mesa edge, the p-electrode is provided within the range wherein the distance between the center of the circle and the p-electrode is ⅓ or more of the diffusion length $L_s$ (12 μm or more in terms of the absolute distance). In other words, the area less than ⅓ of the diffusion length $L_s$ (less than 12 μm in terms of the absolute distance) from the center of the circle is the p-electrode restricted area.

Figure 4A:
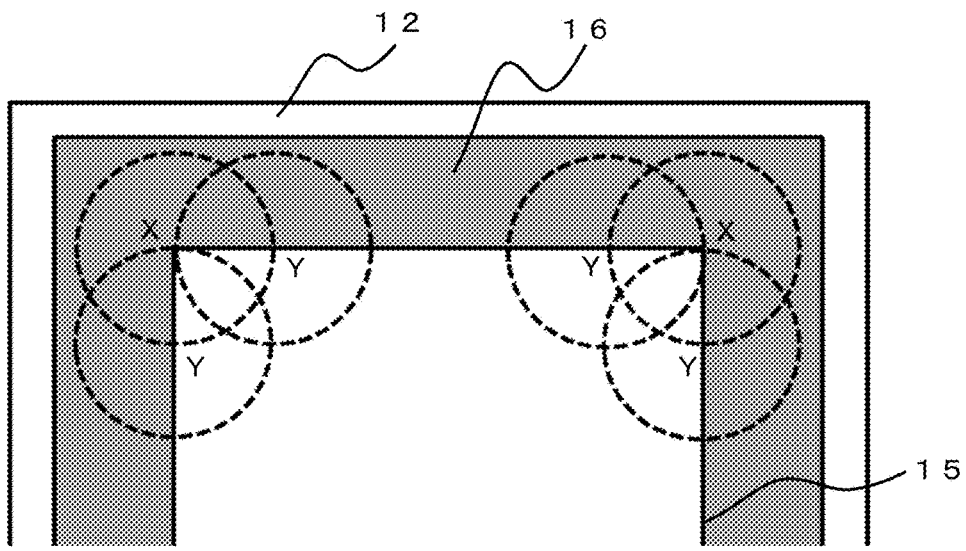
FIG. 4A shows the method of determining the p-electrode restricted area.
Figure 4B:
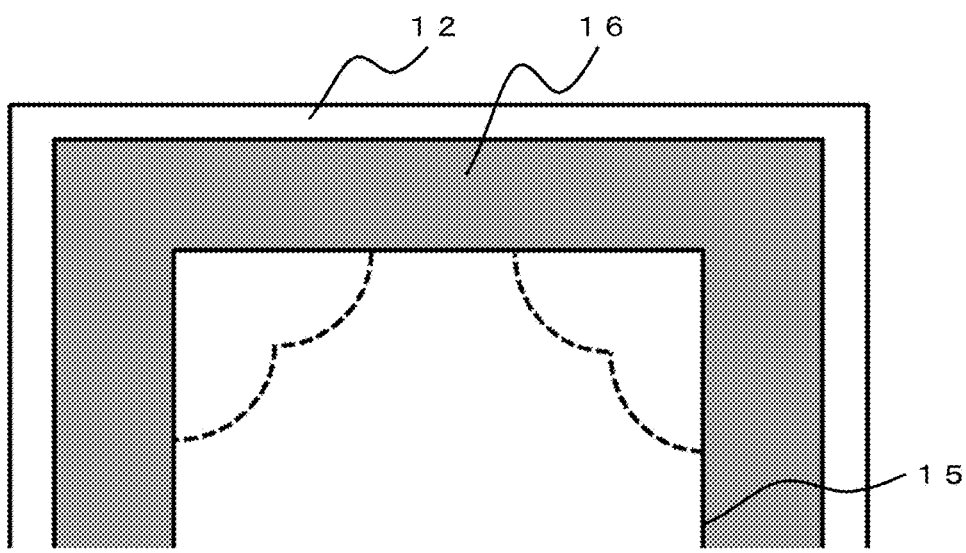
FIG. 4B shows the method of determining the p-electrode restricted area.

The above discussion will be described in further detail by referring to FIG. 4. Note that, the n-type layer and the taper part exposed between the electrodes are small in FIG. 4 as well, thus these are not shown in the figure. For the reference circle at point "X" of FIG. 4A (the corner point of the rectangular parallelepiped shape), the evaluation parameter is about 300%. Therefore, the p-electrode is not formed within the range less than ⅓ of the diffusion length $L_s$ (less than 12 μm in terms of the absolute distance) from the point "X" of the rectangular parallelepiped shape. Also, for the reference circle at the point "Y" (the mesa edge at the distance of the radius of the reference circle at the point "X") of FIG. 4A, the evaluation parameter is about 100%. Therefore, the limit of forming the p-electrode is on the circle wherein the radius from the point "Y" is ⅓ of diffusion length $L_s$ (12 μm in terms of the absolute distance). Here, if the length of the radius of the reference circle is ⅓ or more of the diffusion length $L_s$, then the p-electrode restricted area is the area surrounded by the broken line and the outline of the mesa part as shown in FIG. 4B. As a result, the electrode structure recited in the third invention can be obtained. Also, the p-electrode restricted area is formed by taking the distance of 12 μm or more from the point "X" and point "Y"; thereby the electrode structure recited in the fourth invention can be obtained.

Note that, the p-electrode is preferably not formed for all of the p-electrode restricted area defined in above, but in the present invention the p-electrode may be formed at a part of the p-electrode restricted area, as long as it does not compromise the effect of the present invention. Particularly, at the part spaced away from the mesa edge, the p-electrode may be formed in some cases. Specifically, among the p-electrode restricted area defined in the above, the p-electrode is not formed in 90% or more, more preferably 98% or more and particularly preferably 99% or more of the area.

In the above, the lower limit of the evaluation parameter is 100%, but the lower limit may be set accordingly depending on the material of the laminate semiconductor layer (the mesa structure part) and the driving environment of the element or so.

For example, in case the material of element easily deteriorates and the driving environment is harsh, then the lower limit of the acceptable evaluation parameter is set low from the point to ensure the suppression of the current concentration to the mesa part, thereby the p-electrode restricted area is made wider. Note that, in this case, the average distance between the p-electrode and the n-electrode is long, thus the driving voltage of the element may increase. For example, the evaluation parameter may be 80% or more, and it may be 60% or more.

On the other hand, in case the material of the element hardly deteriorates, and the driving environment is mild, then the current concentration to the mesa part can be accepted to certain degree, thus the lower limit of the evaluation parameter is set high, and the p-electrode restricted area may be narrow. For example, the evaluation parameter may be 120% or more, and it may be 140% or more.

Note that, if the appropriate reference circle is difficult to set, then for the current product, the radius of the reference circle may be 12 µm. Also, as the electrode becomes narrower, the radius of the reference may become smaller, thereby the appropriate evaluation can be carried out. Note that, in this case, the circle should not contact with other mesa edge.

Figure 5:
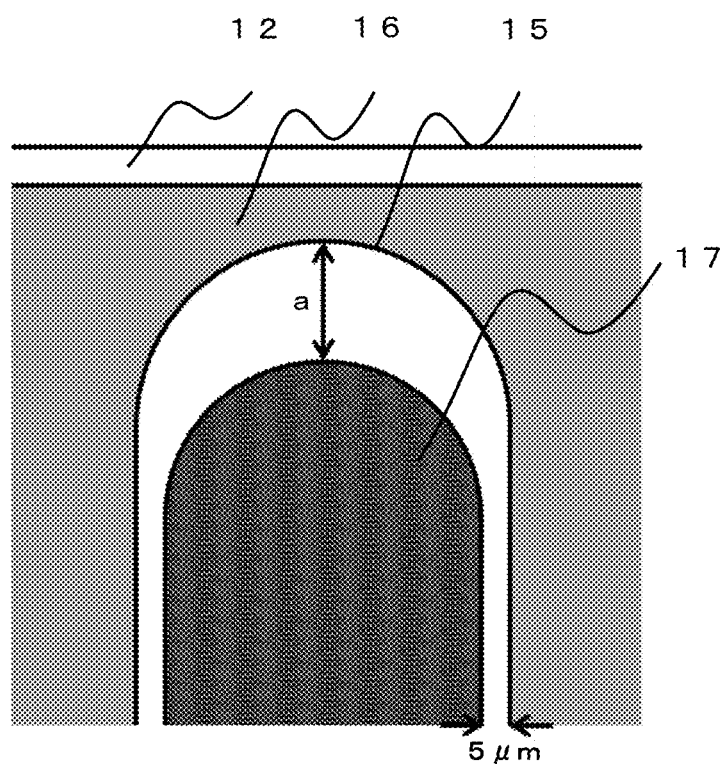
FIG. 5 shows the relationship of the position of the mesa edge and the p-electrode of the element in the example.

In the above embodiment, the p-electrode restricted area is provided within the predetermined range from "the projection part of the mesa edge". The p-electrode is formed to the mesa part other than the p-electrode restricted area (hereinafter it may be referred as "the p-electrode allowed area"), but the p-electrode does not necessarily have to be formed at the entire p-electrode allowed area. The p-electrode only needs to be formed so that it is conducted to at least part of the p-electrode allowed area. The outer shape of the p-electrode formed near the projection part of the mesa edge is preferably formed in an arc shape as shown in FIG. 5, an oval arc shape and a parabolic shape or so.

Also, from the point of the technology for forming the p-electrode, it is difficult to form the p-electrode so that the mesa edge and the edge part of the p-electrode matches, thus a space may be provided in a width less than ⅓ of the diffusion length 4L or less than 12 µm between the edge part of the p-electrode and the mesa edge. Note that, FIG. 5 shows an example provided with the space having the width of 5 µm.

Further, for the third and the fourth inventions, p-electrode is not provided within the predetermined range from "the projection part of the mesa edge" wherein the evaluation parameter becomes certain value or more, but the evaluation parameter showing the degree of the projection of the mesa part as discussed in above continuously changes due to the shape of the mesa edge. Therefore, depending on the degree of the projection of the mesa part, the distance from the mesa edge to the p-electrode may be provided. In FIG. 4A, the evaluation parameter at the point "X" is high (the mesa part is highly projected out), thus the p-electrode is prohibited from forming near this area (for example within 12 µm). However, the evaluation parameter of the point "Y" is low, and the current concentration barely occurs, thus the distance between the point "Y" and the p-electrode may be less than ⅓ of the diffusion length $L_s$ or less than 12 µm.

That is, at the mesa edge having high degree of projection towards the n-electrode forming area, a sufficient distance is taken with the p-electrode; and for the mesa edge having low degree of projection, the distance between the p-electrode and the mesa edge can be short. For example, at the arbitrary point on the mesa edge, the evaluation parameter is determined, and based on the result thereof, "the degree of the projection" is evaluated, thereby the p-electrode restricted area from said mesa edge may be set.

That is, at the mesa edge having high evaluation parameter, the p-electrode restricted area is larger; and at the mesa edge having low evaluation parameter, the p-electrode regulated area may be smaller than the above mentioned. Therefore, it may be effective to define the p-electrode regulated area using the absolute value or squared value of the evaluated parameter.

Figure 6A:
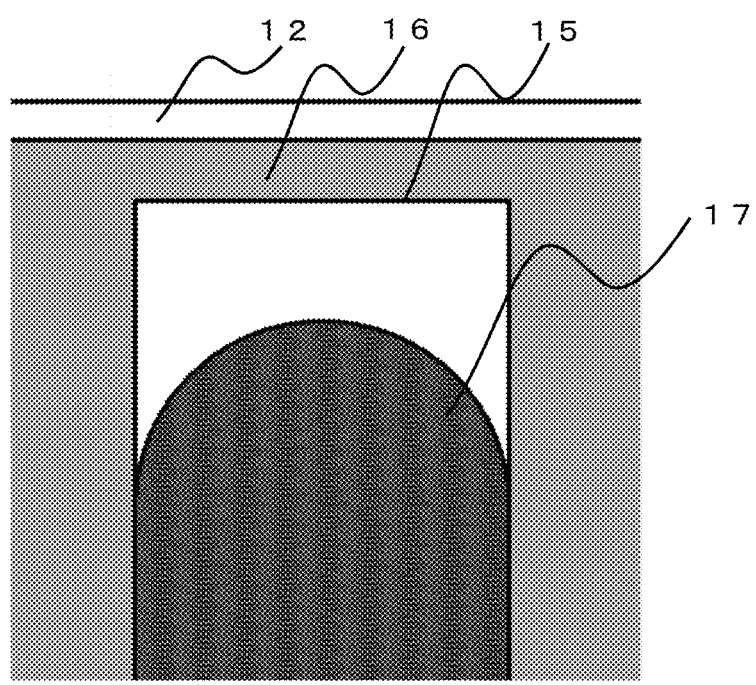
FIG. 6A shows the example of the relationship of the position between the mesa edge and the p-electrode.

In case the mesa edge is the edge part of the rectangular parallelepiped shape as shown in FIG. 6A, the distance from the corner point of the rectangular parallelepiped shape to the p-electrode is long in the longitudinal direction, thus the p-electrode is provided so that the distance from the middle point in the short direction of the rectangular parallelepiped shape to the p-electrode is short. The distance with the p-electrode continuously changes such that it is long from the corner point in the longitudinal direction and short from the middle point; and as approaching the middle point, the change in the distance becomes moderate. In the longitudinal direction, the mesa edge and the p-electrode edge part may match at the end.

Figure 6B:
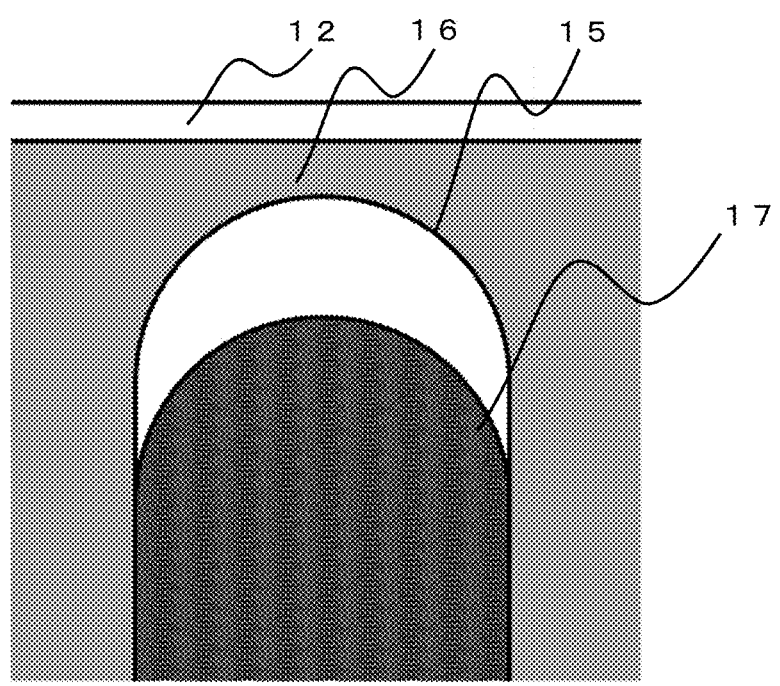
FIG. 6B shows the example of the relationship of the position between the mesa edge and the p-electrode.

In case the mesa edge is an arc or oval arc shape as shown in FIG. 6B, the distance from the top of the arc (oval arc) in the short direction is long. As the arc (oval arc) of the mesa edge turns to a straight line along the longitudinal direction, the p-electrode is provided so that the distance between the mesa edge and the p-electrode becomes shorter. The distance with the p-electrode is long from the top of the arc mesa edge, and short from the both end of the arc; thus the distance continuously changes, and as approaching to the both ends, the change in the distance becomes moderate. In the longitudinal direction, the mesa edge and the p-electrode edge part may match at the end.

Also, in the group III nitride semiconductor luminescence element of the present invention, regarding the luminescence intensity distribution of the light emitted from the opposite plane (hereinafter it may be referred as "the luminescence plane") of the laminate plane of the substrate 11, the maximum value and the minimum value of the luminescence intensity has a ratio (hereinafter, it may be referred as the luminescence intensity ratio) of preferably 2.1 or less. According to the present invention, a local current concentration at the mesa structure can be prevented, thus the luminescence intensity at the luminescence area of the luminescence plane is suppressed from varying. The ratio between the maximum value and minimum value of the luminescence intensity is more preferably 2.05 or less. Note that, the luminescence intensity distribution can be obtained by measuring the luminescence intensity distribution of the luminescence element which is described in below; and the maximum value and minimum value of the luminescence intensity is the maximum value and minimum value of the luminescence intensity at the luminescence area of the luminescence plane. The luminescence area of the luminescence plane is the area emitting the light among the opposite plane of the laminate plane of the substrate 11.

<Production of the Luminescence Element>

After producing the wafer including the constitution of the above mentioned group m nitride semiconductor luminescence element, the lower face of the translucent substrate 11 is ground or polished, thereby the translucent substrate 11 is made thin and the transmission factor can be improved. Then, the luminescence element is produced using the known separation method of the luminescence element such as scribing, dicing and laser welding or so.

Note that, in the above mentioned description of the present invention, the example of modifying the shape of the p-electrode has been shown, but obviously, in order to improve the performance, the luminescence element of the present invention may be combined with the conventional technology such as forming the high resistance layer, and forming the trench or so.

<Measurement of the Luminescence Intensity Distribution of the Luminescence Element>

While continuously running the current between n-electrode and p-electrode of the luminescence element, the luminescence intensity of the light emitted from the opposite face of the laminate plane of the substrate 11 of the luminescence element is measured. The device for measuring the luminescence intensity distribution comprises an electric control circuit applying the voltage to the luminescence element, an optical system regulating the measuring range by lens and camera, a photodetection part, and a data analysis device. The area of 10 μm×10 μm is defined as 1 range, and the luminescence intensity in the luminescence area of the luminescence plane is measured and mapped, thereby the distribution of the luminescence intensity is measured. The place where the current concentration takes place is observed with strong luminescence intensity, hence the effect of current concentration suppression due to the regulation of the distance between the mesa edge and the p-electrode can be confirmed by this measurement.

EXAMPLE

Next, the present invention will be described in further detail by the examples; however the present invention is not to be limited thereto.

Examples 1 and 2, and Comparative Examples 1 and 2

The laminate semiconductor layer having the cross section structure shown in FIG. 7B was formed.

First, using MOCVD method, $Al_{0.7}Ga_{0.3}N$ layer (1 μm) doped with $1.0 \times 10^{19}$ [$cm^{-3}$] of Si was formed as the n-type semiconductor layer on the C-plane AlN substrate (square having 7 mm on one side, thickness of 500 μm). The active layer having the quantum well structure (quantum well layer of 2 nm, and barrier layer of 7 nm) was formed on this n-type layer. Here, the compositions of the quantum well layer and the barrier layer were $Al_{0.8}Ga_{0.2}N$ and $Al_{0.7}Ga_{0.3}N$ respectively, and $1.0 \times 10^{18}$ [$cm^{-3}$] of Si was doped to the barrier layer. The active layer constitutes from the laminate structure comprising three layers of the quantum well layers and four layers of the barrier layers.

Next, on this active layer, AlN layer (15 nm) doped with $5 \times 10^{19}$ [$cm^{-3}$] of Mg was formed as the electron block layer. Then, on the electron block layer, $Al_{0.8}Ga_{0.2}N$ layer (50 nm) doped with $5 \times 10^{19}$ [$cm^{-3}$] of Mg was formed as the p-clad layer. Lastly, on the p-clad layer, GaN layer (100 nm) doped with $2 \times 10^{19}$ [$cm^{-3}$] of Mg was formed as the p-contact layer.

Next, the obtained semiconductor wafer was heat treated in $N_2$ atmosphere or 20 minutes at 900° C. Then, after forming a predetermined metal mask pattern on the surface of the p-contact layer by a photolithography and a vacuum evaporation, the dry etching was carried out to the p-contact layer surface not formed with the pattern until the n-type layer was exposed, thereby a cross shape mesa structure having a round end part as shown in FIG. 1C was formed. Here, the amount ground by the etching of the n-type layer was 300 nm. Next, a resist pattern was formed on the p-contact layer by photolithography, then Ti (20 nm)/Al (200 nm)/Au (5 nm) layer was formed by vacuum evaporation, and a heat treatment was carried out for 1 minute at 810° C. in $N_2$ atmosphere thereby the n-electrode was formed. Similarly, as shown in FIG. 5, Ni (20 nm)/Au (50 nm) layer was formed on the p-type layer so that the predetermined range from the edge part was the p-electrode restricted area, then the p-electrode was formed by firing for 3 minutes at 550° C. in $O_2$ atmosphere. The obtained semiconductor wafer was cut out in a square having 750 μm on one side; thereby the nitride semiconductor luminescence element was made (the nitride semiconductor luminescence element having the luminescence peak wavelength of 265 nm).

Note that, four types of elements comprising the p-electrode restricted area were made so that the distance (a) from the mesa edge of the projection part to the p-electrode were 40 μm (Example 1), 20 μm (Example 2), 10 μp (Comparative example 1) and 5 μm (Comparative example 2). Also, the distance between the mesa edge and the p-electrode in the p-electrode allowed area was 5 μm. For each examples and comparative examples as mentioned in above, 50 elements were produced, and for the obtained luminescence elements, the output characteristics over the time were measured. Note that, for the measurement of the instantaneous deterioration rate, the result of running 150 mA of current is shown.

In the luminescence element of Example 1, the instantaneous deterioration rate (the ratio of the element having significant drop of the output among all of the elements (the ratio of the element deteriorated due to the current concentration at the p-electrode)) after 500 hours was 2%. On the contrary Example 2 showed 4%, Comparative example 1 showed 20% and Comparative example 2 showed 24%. Hence, when the distance between the mesa edge and the p-electrode is 20 μm or more in the p-electrode restricted area, then significant improvement of the instantaneous deterioration rate was observed. Note that, when the diffusion length $L_s$ of the obtained luminescence element was calculated, it was 60 μm; hence 20 μm is ⅓ of the diffusion length $L_s$.

Examples 3 and 4, and Comparative Examples 3 and 4

The nitride semiconductor luminescence element was produced as same as Example 1, except for changing the amount of ground of the n-type layer by dry etching to 100 nm when forming the n-electrode.

Note that, as similar to the method of Example 1, four types of elements comprising the p-electrode restricted area were made so that the distance (a) from the mesa edge of the projection part to the p-electrode were 20 μm (Example 3), 12 μm (Example 4), 8 μm (Comparative example 3) and 5 μm (Comparative example 4). Further, the distance between mesa edge and the p-electrode in the p-electrode allowed area was 5 μm. For each examples and comparative examples as mentioned in above, 50 elements were produced, and for the obtained luminescence elements, the output characteristics over the time were measured.

In the luminescence element of Example 3, the instantaneous deterioration rate (the ratio of the element having significant drop of the output among all of the elements (the ratio of the element deteriorated due to the current concentration at the p-electrode)) after 500 hours was 2%. On the contrary Example 4 showed 4%, Comparative example 3 showed 16% and Comparative example 4 showed 24%. Hence, when the distance between the mesa edge and the p-electrode is 12 μm or more in the p-electrode restricted area, then significant improvement of the instantaneous deterioration rate was observed. Note that, when the diffusion length $L_s$ of the obtained luminescence element was calculated, it was 36 μm; hence 12 μm is ⅓ of the diffusion length $L_s$.

Also, regarding the nitride semiconductor luminescence element obtained from Example 3 and Example 4, and Comparative example 3 and Comparative example 4, the results of measuring the ratio between the maximum value and the minimum value of the luminescence intensity (the luminescence intensity ratio) in the luminescence area of the luminescence plane are shown in Table 1. The luminescence intensity ratio was 2.10 (Example 4), when the distance between the p-electrode and the mesa edge is 12 μm which corresponds to ⅓ of the diffusion length $L_s$. That is, by regulating the distance between the p-electrode and the mesa edge to ⅓ or more of the diffusion length $L_s$, the luminescence intensity ratio becomes 2.1 or less, and also the instantaneous deterioration rate can be suppressed.

TABLE 1

|  | Example 3 | Example 4 | Comparative example 3 | Comparative example 4 |
|---|---|---|---|---|
| Distance between p-electrode and and mesa edge at projection part [μm] | 20 | 12 | 8 | 5 |
| Instantaneous deterioration rate [%] | 2 | 4 | 16 | 24 |
| Luminescence intensity ratio | 2.02 | 2.10 | 2.28 | 2.50 |

INDUSTRIAL APPLICABILITY

In the present invention, when viewing the group III nitride semiconductor luminescence element from the top, the distance between a part of an edge of said mesa structure and an outer peripheral of said p-electrode is predetermined value or more, thereby the current running between the p-electrode and the n-electrode is suppressed from concentrating near the mesa edge without excessively increasing the driving voltage. As a result, the group III nitride semiconductor luminescence element can be obtained which barely having a local deterioration at the mesa structure, and also barely having uneven luminescence because the current uniformly runs in the active layer.

NUMERICAL REFERENCES

11 . . . Substrate
12 . . . N-type layer
13 . . . Active layer
14 . . . P-type layer
15 . . . Mesa structure
16 . . . N-electrode
17 . . . P-electrode
20 . . . Group III nitride semiconductor luminescence element

The invention claimed is:

1. A group III nitride semiconductor luminescence element, comprising:
   a substrate,
   a n-type layer arranged on the substrate,
   an active layer laminated on the n-type layer, and
   a p-type layer laminated on the active layer,
   wherein the active layer and the p-type layer are partially removed on the n-type layer to form an exposed face of the n-type layer and a mesa structure comprising remains of the active layer and the p-type layer,
   wherein a p-electrode is provided on the p-type layer,
   wherein a n-electrode is provided on at least a part of the exposed face of the n-type layer,
   wherein from a top view of the group III nitride semiconductor luminescence element, the mesa structure has a projection part surrounded by the n-electrode, and
   wherein at the projection part, the p-electrode is not formed within a range from an edge of the mesa structure to 1) less than ⅓ of a diffusion length $L_s$ or 2) less than 12 μm.

2. The group III nitride semiconductor luminescence element according to claim 1, wherein at the projection part, the p-electrode is not formed within a range from an edge of the mesa structure to less than ⅓ of a diffusion length $L_s$.

3. The group III nitride semiconductor luminescence element according to claim 1, wherein at the projection part, the p-electrode is not formed within a range from an edge of the mesa structure to less than 12 μm.

4. The group III nitride semiconductor luminescence element according to claim 1, wherein a luminescence peak wavelength is 200 to 350 nm.

5. The group III nitride semiconductor luminescence element according to claim 1, wherein the substrate comprises SiC, AlN, or Si.

6. The group III nitride semiconductor luminescence element according to claim 1, wherein the substrate comprises AlN.

7. The group III nitride semiconductor luminescence element according to claim 1, wherein the n-type layer comprises $Al_xIn_yGa_zN$, wherein x, y, and z are rational number satisfying $0<x\leq1.0$, $0\leq y\leq0.1$, $0\leq z<1.0$, and $x+y+z=1.0$.

8. A group III nitride semiconductor luminescence element, comprising:
   a substrate;
   a n-type layer on the substrate;
   an active layer laminated on the n-type layer; and
   a p-type layer laminated on the active layer,
   wherein the active layer and the p-type layer are partially removed on the n-type layer to form an exposed face of the n-type layer, and an n-electrode is provided on at least a part of the exposed face,
   wherein a p-electrode is provided on the p-type layer, and the p-electrode is recessed from an outer peripheral part of the p-type layer by less than ⅓ of a diffusion length $L_s$ or less than 12 μm.

9. The group III nitride semiconductor luminescence element according to claim 8, wherein the substrate comprises SiC, AlN, or Si.

* * * * *